United States Patent
Lai et al.

(10) Patent No.: US 10,111,315 B1
(45) Date of Patent: Oct. 23, 2018

(54) ARC SUPPRESSION DEVICE AND ARC SUPPRESSION METHOD

(71) Applicant: DELTA ELECTRONICS, INC., Taoyuan (TW)

(72) Inventors: Wei-Hsun Lai, Taoyuan (TW); Chien-Yu Wang, Taoyuan (TW); Po-Cheng Chiu, Taoyuan (TW); Chih-Chun Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/810,153

(22) Filed: Nov. 13, 2017

(30) Foreign Application Priority Data

Jul. 14, 2017 (CN) .......................... 2017 1 0575768

(51) Int. Cl.
| | | |
|---|---|---|
| *H05B 39/00* | (2006.01) | |
| *H05H 1/48* | (2006.01) | |
| *H02H 1/00* | (2006.01) | |
| *H02H 9/00* | (2006.01) | |
| *H02M 1/32* | (2007.01) | |

(52) U.S. Cl.
CPC ............ *H05H 1/48* (2013.01); *H02H 1/0015* (2013.01); *H02H 9/001* (2013.01); *H02M 1/32* (2013.01)

(58) Field of Classification Search
CPC ........ H02H 1/0015; H02H 9/001; H05H 1/48; H02M 1/32
USPC ........................................................ 315/207
See application file for complete search history.

(56) References Cited

U.S. PATENT DOCUMENTS

| | | | |
|---|---|---|---|
| 5,427,669 A | 6/1995 | Drummond | |
| 5,726,849 A * | 3/1998 | Nakamura | ............. H02H 9/001 361/93.5 |
| 7,262,606 B2 | 8/2007 | Axenbeck et al. | |
| 7,640,120 B2 | 12/2009 | Axenbeck et al. | |
| 7,929,261 B2 | 4/2011 | Wiedemuth | |
| 7,995,313 B2 | 8/2011 | Nitschke | |
| 8,007,641 B2 | 8/2011 | Winterhalter et al. | |
| 8,033,246 B2 | 10/2011 | Wiedemuth et al. | |
| 8,085,054 B2 | 12/2011 | Zaehringer | |
| 2002/0191359 A1* | 12/2002 | Chen | ...................... H02H 9/001 361/58 |
| 2013/0141954 A1* | 6/2013 | Chang | ..................... H02J 9/061 363/84 |
| 2014/0239813 A1* | 8/2014 | Van Zyl | .............. H01J 37/3299 315/111.21 |
| 2015/0214927 A1* | 7/2015 | Greene | ..................... H02J 1/10 307/104 |

(Continued)

*Primary Examiner* — Don Le
(74) *Attorney, Agent, or Firm* — CKC & Partners Co., Ltd.

(57) ABSTRACT

An arc suppression device includes an AC to DC converter, a switch, a resistor and a controller. The switch is coupled between the AC to DC converter and a plasma chamber. The resistor is coupled in parallel with the switch. The AC to DC converter is configured to convert an AC voltage into a DC voltage for providing to the plasma chamber. The controller is configured to detect a unit-time rate of change (ROC) of a plasma current received by the plasma chamber. When the controller determines that the unit-time ROC of the plasma current is larger than a first unit-time ROC threshold, the controller controls the switch to electrically isolate the AC to DC converter and the plasma chamber to reduce the plasma current to a first current value through the resistor.

16 Claims, 7 Drawing Sheets

(56) References Cited

U.S. PATENT DOCUMENTS

| 2016/0066375 A1* | 3/2016 | Seki | H05B 33/0815 |
| | | | 315/224 |
| 2017/0265287 A1* | 9/2017 | Avrahamy | H05B 37/0272 |

* cited by examiner

ARC SUPPRESSION DEVICE AND ARC SUPPRESSION METHOD

RELATED APPLICATIONS

This application claims priority to China Application Serial Number 201710575768.5, filed Jul. 14, 2017, which is herein incorporated by reference.

BACKGROUND

Technical Field

The present disclosure relates to arc suppression technology. More particularly, the present disclosure relates to an arc suppression device and an arc suppression method for continuous energy output.

Description of Related Art

In plasma process, when an arc occurs in a plasma chamber, low yield of the process is easily caused by the arc. However, in order to eliminate the arc in the plasma chamber, cutting off power outputted to the plasma chamber would cause a problem of non-continuous energy. Moreover, if output of the power is controlled by many switching elements, then operation becomes more complicated.

SUMMARY

An aspect of the present disclosure is to provide an arc suppression device. The arc suppression device includes an AC to DC converter, a switch, a resistor and a controller. The switch is coupled between the AC to DC converter and the plasma chamber. The resistor is coupled in parallel with the switch. The controller is coupled to the switch. The AC to DC converter is configured to convert an AC voltage to a DC voltage for providing to a plasma chamber. The controller is configured to detect a unit-time rate of change (ROC) of a plasma current received by the plasma chamber. When the controller determines that the unit-time ROC of the plasma current is larger than a first unit-time ROC threshold, the controller is configured to control the switch to electrically isolate the AC to DC converter and the plasma chamber to reduce the plasma current to a first current value through the resistor.

Another aspect of the present disclosure is to provide an arc suppression method that includes steps as follows. By a controller, a switch is controlled to electrically isolate an AC to DC converter and a plasma chamber to reduce the plasma current to a first current value through a resistor when a unit-time ROC of a plasma current received by a plasma chamber is determined to be larger than a first unit-time ROC threshold. The switch is electrically coupled between the AC to DC converter and the plasma chamber, and the resistor is coupled in parallel with the switch.

In conclusion, when the arc occurs, the arc suppression device can reduce the plasma current outputted to the plasma chamber to the first current value through the resistor, to eliminate the arc. Moreover, because the arc suppression device does not stop outputting to the plasma chamber (i.e., does not reduce the plasma current to zero), therefore the arc suppression device can rapidly resume normal operation for the plasma chamber after the arc is eliminated.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the present disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Unless otherwise indicated, all numbers expressing quantities, conditions, and the like in the present disclosure and claims are to be understood as modified in all instances by the term "about." The term "about" refers, for example, to numerical values covering a range of plus or minus 20% of the numerical value. The term "about" preferably refers to numerical values covering range of plus or minus 10% (or most preferably, 5%) of the numerical value. The modifier "about" used in combination with a quantity is inclusive of the stated value.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Figure 1:
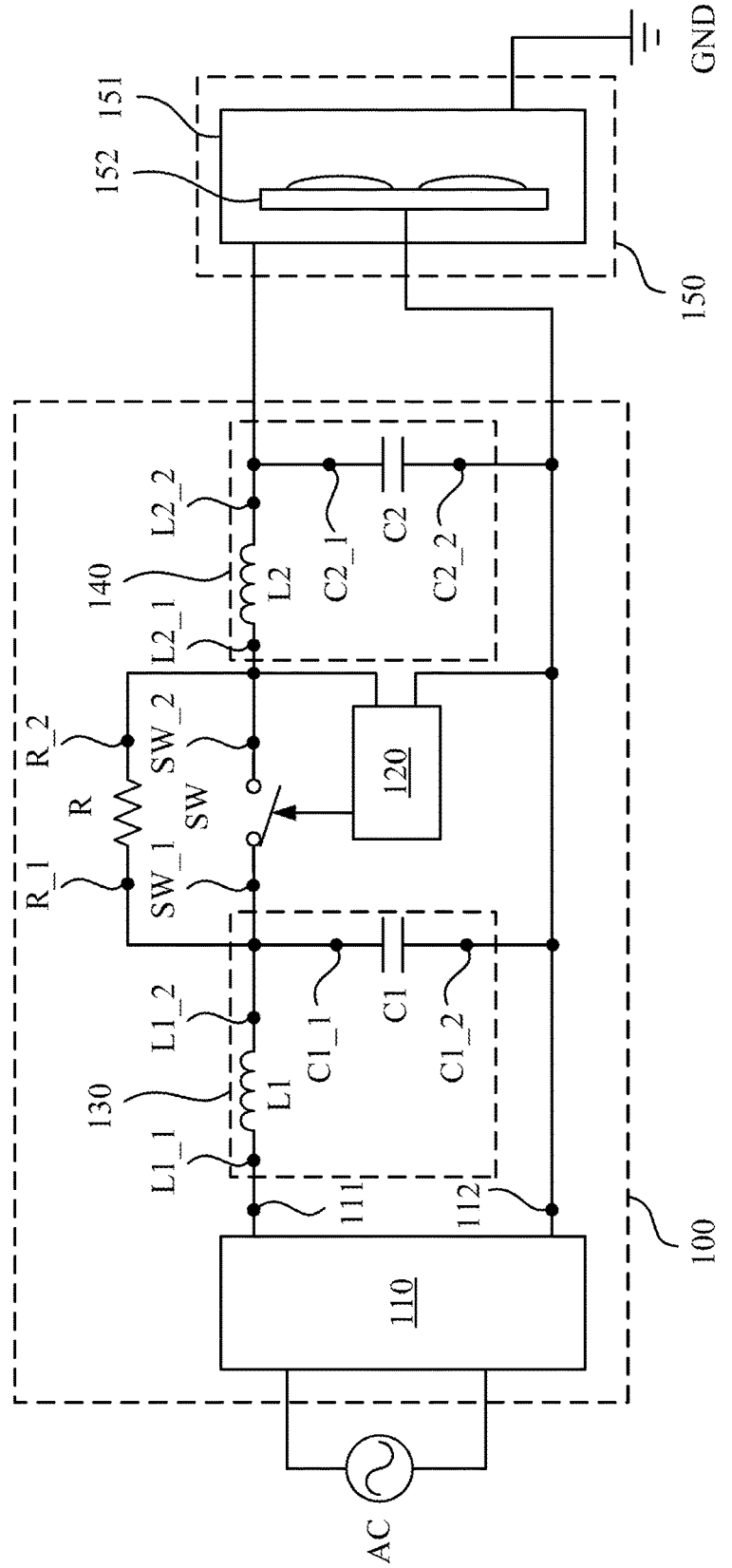
FIG. 1 is a schematic diagram of an arc suppression device according to an embodiment of the present disclosure.
Figure 3A:
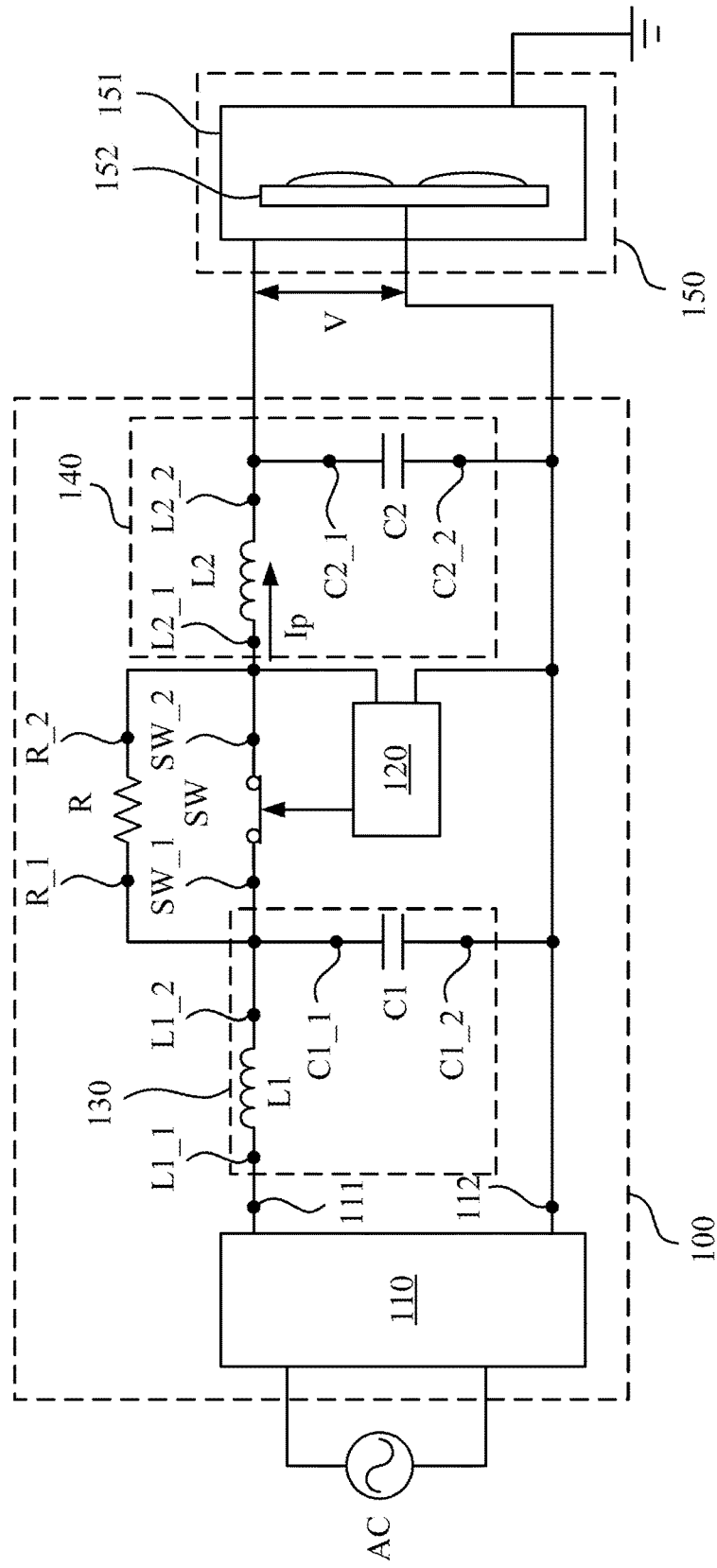
FIG. 3A is a schematic diagram of an arc suppression device according to an embodiment of the present disclosure.
Figure 3B:
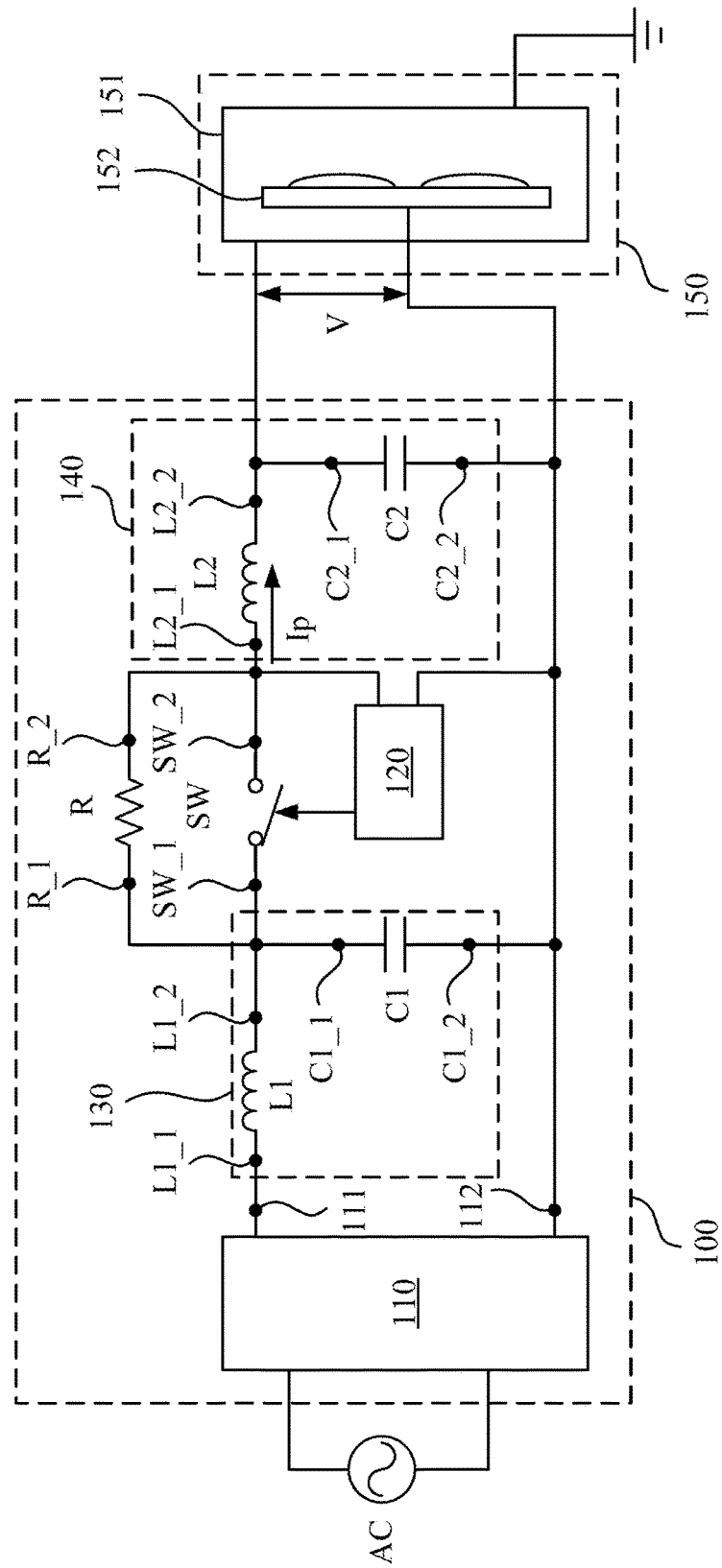
FIG. 3B is a schematic diagram of an arc suppression device according to an embodiment of the present disclosure.

Reference is made to FIG. 1. FIG. 1 is a schematic diagram of an arc suppression device 100 according to an embodiment of the present disclosure. The arc suppression device 100 includes an AC to DC converter 110, a switch SW, a resistor R and a controller 120. The switch SW is coupled between the AC to DC converter 110 and the plasma chamber 150, the resistor R is coupled in parallel with the switch SW, and the controller 120 is coupled to the switch SW. The AC to DC converter 110 is configured to convert an AC voltage generated by an AC power supply AC to a DC voltage for providing to a plasma chamber 150. In an embodiment, a plasma voltage (shown as plasma voltage V in FIG. 3A) of the plasma chamber 150 is associated with the DC voltage outputted by the AC to DC converter 110. For example, the plasma voltage of the plasma chamber 150 is the DC voltage that is filtered.

Figure 2:
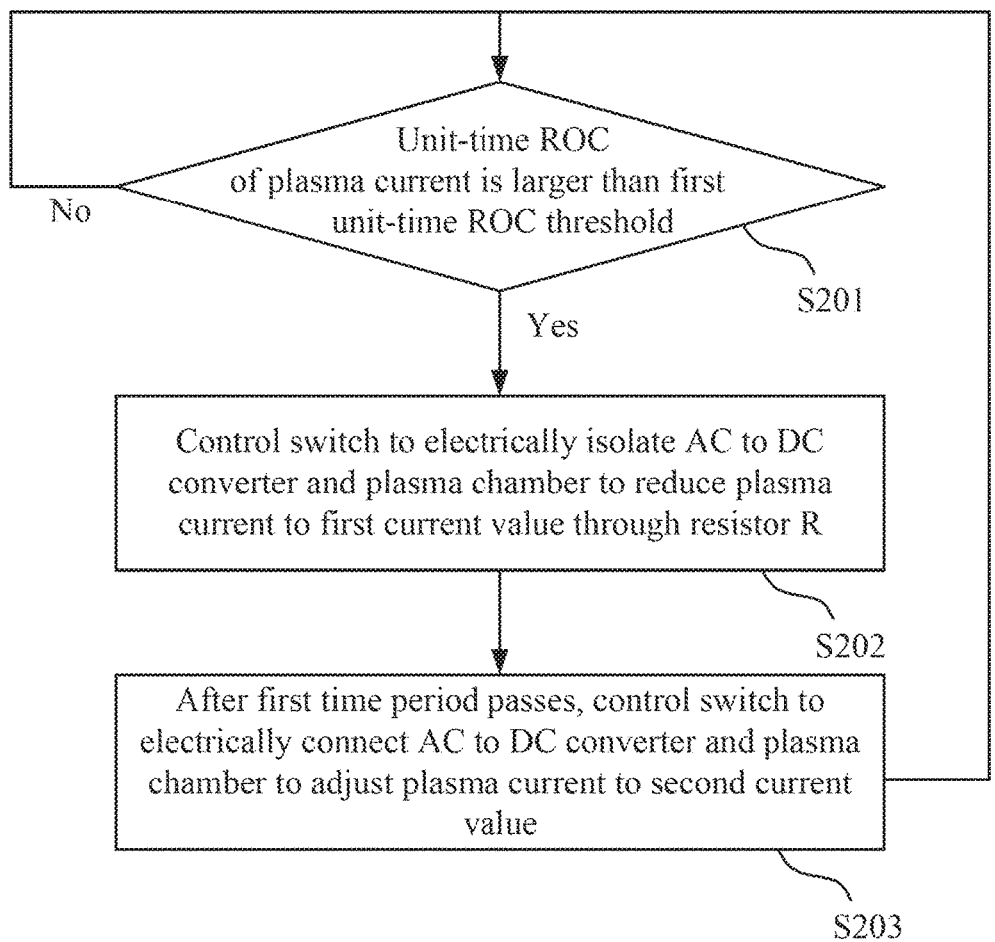
FIG. 2 is a flow chart of an arc suppression method according to an embodiment of the present disclosure.

In operation, reference is made to FIGS. 2, 3A, 3B, 4A, 4B and 4C. FIG. 2 is a flow chart of an arc suppression method 200 according to an embodiment of the present disclosure. The visual assist method 200 includes steps S201-S203, and the arc suppression method 200 can be applied to the arc suppression device 100 as shown in FIG. 1. However, those skilled in the art should understand that the mentioned steps in the present embodiment are in an adjustable execution sequence according to the actual demands except for the steps in a specially described sequence, and even the steps or parts of the steps can be executed simultaneously.

The following paragraphs are sequentially described according to cases of an arc and a severe arc. In a case of the arc or the severe arc, the controller 120 may be selectively configured to detect a plasma current Ip, a plasma voltage V or simultaneously detect the plasma current Ip and the plasma voltage V, to finish an operation of eliminating the arc. Related operations are described with details in the following paragraphs.

Figure 4A:
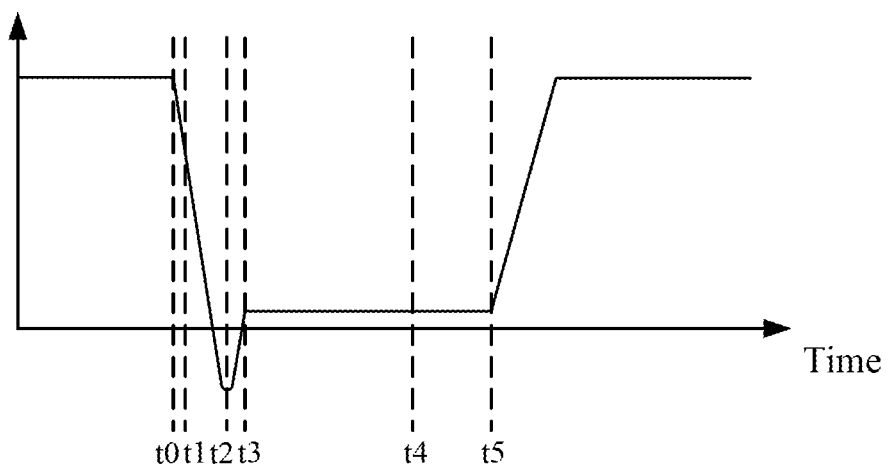
FIG. 4A is a waveform diagram corresponding to arc suppression devices in FIGS. 3A and 3B according to an embodiment of the present disclosure.

The following description is associated with a case where an arc occurs. In an embodiment, the controller 120 is configured to detect a unit-time rate of change (ROC) of the plasma current Ip received by the plasma chamber 150. When an arc occurs in the plasma chamber 150 at a time t0, the plasma voltage V starts to decrease (as shown in FIG. 4A), and the unit-time ROC of the plasma current Ip increases (as shown in 4B). In step S201, the controller 120 determines whether the unit-time ROC of the plasma current Ip received by the plasma chamber 150 is larger than the first unit-time ROC threshold. In an embodiment, the first unit-time ROC threshold may be designed as a unit-time ROC of the plasma current Ip when the arc occurs.

For example, at time t1, the controller 120 determines that the unit-time ROC of the plasma current Ip is larger than the first unit-time ROC threshold, and then the controller 120 controls the switch SW to electrically isolate the AC to DC converter 110 and the plasma chamber 150 to reduce the plasma current Ip to a first current value I1 through the resistor R in step S202. In other words, when the controller 120 determines that an arc occurs in the plasma chamber 150 and controls the switch SW to cut off, then most of power is consumed at the resistor R, and the plasma current Ip is reduced to the first current value I1 during a time period from time t1 to time t3 to eliminate the arc.

Alternatively, in another embodiment, the controller 120 is further configured to detect a plasma voltage V received by the plasma chamber 150. In step S201, the controller 120 determines whether the unit-time ROC of the plasma current Ip received by the plasma chamber 150 is larger than the first unit-time ROC threshold, and whether the plasma voltage V is smaller than a first voltage threshold. In some embodiments, a range of the first voltage threshold may be 11-100 volts (V). However, the present disclosure is not limited thereto. For example, at time t1, the controller 120 determines that the unit-time ROC of the plasma current Ip is larger than the first unit-time ROC threshold and the plasma voltage V is smaller than the first voltage threshold, and then the controller 120 controls the switch SW to electrically isolate the AC to DC converter 110 and the plasma chamber 150 to reduce the plasma current Ip to the first current value I1 through resistor R in step S202.

Figure 4B:
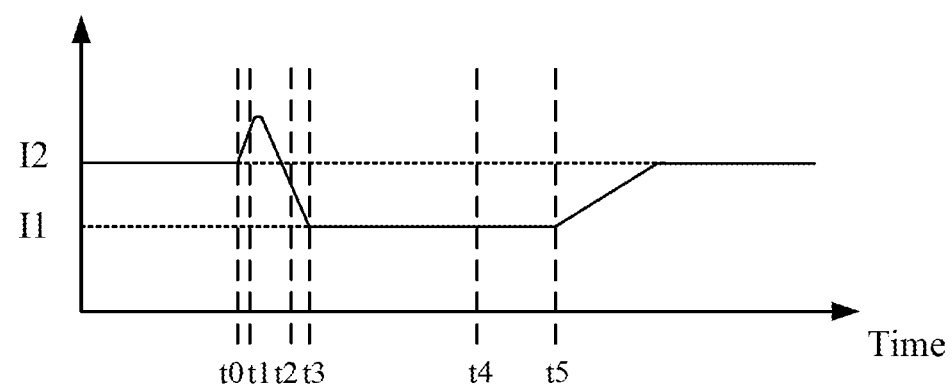
FIG. 4B is a waveform diagram corresponding to arc suppression devices in FIGS. 3A and 3B according to an embodiment of the present disclosure.
Figure 4C:
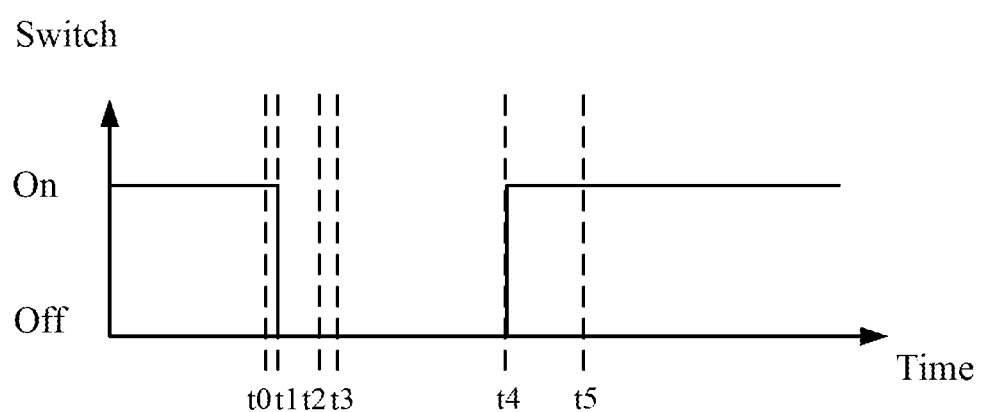
FIG. 4C is a waveform diagram corresponding to arc suppression devices in FIGS. 3A and 3B according to an embodiment of the present disclosure.

In step S203, after a first time period (e.g., a time period from time t1 to time t4) passes, the controller 120 controls the switch SW to electrically connect the AC to DC converter 110 and the plasma chamber 150 to adjust the plasma current Ip to a second current value I2. As shown in FIG. 4B, the second current value I2 is larger than the first current value I1.

As a result, when the arc occurs, the arc suppression device 100 can reduce the plasma current Ip outputted to the plasma chamber 150 to the first current value I1 through the resistor R to eliminate the arc. Moreover, because the arc suppression device 100 does not stop outputting to the plasma chamber 150 (i.e., does not reduce the plasma current Ip to zero), therefore after the arc is eliminated, the arc suppression device 100 can rapidly resume normal operation for the plasma chamber 150.

The following description is associated with a case where a severe arc occurs. In another embodiment, in step S201, the controller 120 determines whether the unit-time ROC of the plasma current Ip received by the plasma chamber 150 is larger than a second unit-time ROC threshold. The second unit-time ROC threshold is larger than the first unit-time ROC threshold. For example, at time t1, the controller 120 determines that the unit-time ROC of the plasma current Ip is larger than the second unit-time ROC threshold (which indicates that a severe arc occurs in the plasma chamber 150), and then the controller 120 controls the switch SW to electrically isolate the AC to DC converter 110 and the plasma chamber 150, and cuts off the AC to DC converter 110 to rapidly eliminate the severe arc in step S202. It should be noted that, compared to the aforementioned case of the arc, in the present embodiment, when the controller 120 determines that the severe arc occurs (i.e., the unit-time ROC of the plasma current Ip is larger than the second unit-time ROC threshold), the controller 120 further controls the switch SW to cut off the AC to DC converter 110, in order to effectively eliminate the severe arc.

Alternatively, in another embodiment, the controller 120 is further configured to detect the plasma voltage V received by the plasma chamber 150. In step S201, the controller 120 determines whether the unit-time ROC of the plasma current Ip received by the plasma chamber 150 is larger than the second unit-time ROC threshold, and whether the plasma voltage V is smaller than the second voltage threshold. In some embodiments, the second voltage threshold may be 11-100 volts (V) and smaller than the first voltage threshold. For example, at time t1, the controller 120 determines that the unit-time ROC of the plasma current Ip is larger than the second unit-time ROC threshold, and the plasma voltage V is smaller than the second voltage threshold (which indicates that the severe arc occurs in the plasma chamber 150), and then the controller 120 controls the switch SW to electrically isolate the AC to DC converter 110 and the plasma chamber 150, and cuts off the AC to DC converter 110 to rapidly eliminate the severe arc in step S202. Moreover, compared to the aforementioned case of the arc, in the present embodiment, when the controller 120 determines the severe arc occurs (i.e., the unit-time ROC of the plasma current Ip is larger than the second unit-time ROC threshold and the plasma voltage V is smaller than the second voltage threshold), the controller 120 further controls the switch SW to cut off the AC to DC converter 110, in order to effectively eliminate the severe arc.

In the above discussed examples of the arc and the severe arc, description is made with operations of the controller 120 to merely detect the plasma current Ip or to simultaneously detect the plasma current Ip and the plasma voltage V. However, the present disclosure is not limited thereto. In various embodiments, the controller 120 may respectively detect the plasma current Ip or the plasma voltage V, or detect the plasma current Ip and the plasma voltage V simultaneously, to eliminate the arc. For example, in the aforementioned step S201, the controller 120 may merely detect the plasma voltage V, and compare the plasma voltage V with the first voltage threshold and/or the second voltage threshold to eliminate the arc. Detecting method by using the plasma voltage V is the same as the above example, and therefore is not repeated herein. Therefore, configurations adaptable to the controller 120 to detect the plasma current Ip and/or the plasma voltage V are within the contemplated scoped of the present disclosure.

It should be noted that, in the present disclosure, after the first time period (e.g., a time period from time t1 to time t4), the controller 120 controls the switch SW to electrically connect the AC to DC converter 110 and the plasma chamber 150, and turns on the AC to DC converter 110, to adjust the plasma current Ip to the second current value I2. As shown in FIG. 4B, because the AC to DC converter 110 needs a certain time (e.g., a time period from time t4 to time t5) to turn on, therefore the plasma current Ip rises to second current value I2 after time t5. Moreover, the second unit-time ROC threshold may be designed as a unit-time ROC of the plasma current Ip when the severe arc occurs.

In an embodiment, the arc suppression device 100 further includes inductor-capacitor (LC) circuits 130 and 140. The inductor-capacitor (LC) circuit 130 is coupled between the AC to DC converter 110 and the controller 120, and configured to filter the DC voltage converted by the AC to DC converter 110. The inductor-capacitor (LC) circuit 140 is coupled between the controller 120 and the plasma chamber 150, and configured to suppress the unit-time ROC of the plasma current Ip and generate the plasma voltage V.

In an embodiment, the inductor-capacitor (LC) circuit 130 includes a inductor L1 and a capacitor C1, the inductor-capacitor (LC) circuit 140 includes a inductor L2 and a capacitor C2. The AC to DC converter 110 has a first terminal 111 and a second terminal 112, the switch SW has a first terminal SW 1 and a second terminal SW 2, the inductor L1 has a first terminal L1_1 and a second terminal L1_2, the capacitor C1 has a first terminal C1_1 and a second terminal C1_2, the inductor L2 has a first terminal L2_1 and a second terminal L2_2, and the capacitor C2 has a first terminal C2_1 and a second terminal C2_2.

Regarding to connection of the inductor-capacitor (LC) circuit 130, the first terminal L1_1 of the inductor L1 is coupled to the first terminal 111 of the AC to DC converter 110, the second terminal L1_2 of the inductor L1 is coupled to the first terminal SW 1 of the switch SW and a first terminal R_1 of the resistor R. The first terminal C1_1 of the capacitor C1 is coupled to the second terminal L1_2 of the inductor L1, and the second terminal C1_2 of the capacitor C1 is coupled to the second terminal 112 of the AC to DC converter 110.

Regarding to connection of the inductor-capacitor (LC) circuit 140, the first terminal L2_1 of the inductor L2 is coupled to the second terminal SW 2 of the switch SW, and the second terminal L2_2 of the inductor L2 is coupled to a shell 151 of the plasma chamber 150 and a ground terminal GND. The first terminal C2_1 of the capacitor C2 is coupled to the second terminal L2_2 of the inductor L2, and the second terminal C2_2 of the capacitor C2 is coupled to the second terminal 112 of the AC to DC converter 110 and a target 152 of the plasma chamber 150.

It should be noted that, at time t2, an inverse voltage (as shown in FIG. 4A) generated because of continuous flow of the plasma current Ip flowing through the inductor L2 is helpful to eliminate the arc.

In an embodiment, an inductance of the inductor L1 (about some hundreds of microhenries (μH)) is larger than an inductance (about some hundreds of microhenries (μH)) of the inductor L2.

In an embodiment, a capacitance (about some tens of nanofarads (nF)) of the capacitor C1 is larger than a capacitance (about some tens of nanofarads (nF)) of the capacitor C2.

In practice, the switch SW may be a transistor (e.g., an insulated gate bipolar transistor (IGBT)), the controller 120 may be a microprocessor control unit (MCU), a field-programmable gate array (FPGA). However, the present disclosure is not limited thereto.

In conclusion, when the arc occurs, the arc suppression device 100 can reduce the plasma current Ip outputted to the plasma chamber 150 to the first current value I1 through the resistor R, to eliminate the arc. Moreover, because the arc suppression device 100 does not stop outputting to the plasma chamber 150 (i.e., does not reduce the plasma current Ip to zero), therefore the arc suppression device 100 can rapidly resume normal operation for the plasma chamber 150 after the arc is eliminated.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An arc suppression device, comprising:
   an AC to DC converter, configured to convert an AC voltage to a DC voltage for providing to a plasma chamber;

a switch, coupled between the AC to DC converter and the plasma chamber;

a resistor, coupled in parallel with the switch;

a controller, coupled to the switch and configured to detect a unit-time rate of change (ROC) of a plasma current received by the plasma chamber, wherein when the controller determines that the unit-time ROC of the plasma current is larger than a first unit-time ROC threshold, the controller is configured to control the switch to electrically isolate the AC to DC converter and the plasma chamber to reduce the plasma current to a first current value through the resistor; and a first inductor-capacitor (LC) circuit configured to filter the DC voltage.

2. The arc suppression device of claim 1, wherein the controller is further configured to cut off the AC to DC converter when the controller determines that the unit-time ROC of the plasma current is larger than a second unit-time ROC threshold.

3. The arc suppression device of claim 1, wherein the first inductor-capacitor (LC) circuit is coupled between the AC to DC converter and the controller.

4. The arc suppression device of claim 3, further comprising:

a second LC circuit, coupled between the controller and the plasma chamber and configured to suppress the unit-time ROC of the plasma current.

5. The arc suppression device of claim 3, wherein the AC to DC converter has a first terminal and a second terminal, the switch has a first terminal and a second terminal, and the first LC circuit comprises:

a first inductor, having a first terminal and a second terminal, wherein the first terminal of the first inductor is coupled to the first terminal of the AC to DC converter, and the second terminal of the first inductor is coupled to the first terminal of the switch; and a first capacitor, having a first terminal and a second terminal, wherein the first terminal of the first capacitor is coupled to the second terminal of the first inductor, and the second terminal of the first capacitor is coupled to the second terminal of the AC to DC converter.

6. The arc suppression device of claim 5, wherein the second LC circuit comprises:

a second inductor, having a first terminal and a second terminal, wherein the first terminal of the second inductor is coupled to the second terminal of the switch, and the second terminal of the second inductor is coupled to a shell of the plasma chamber; and a second capacitor, having a first terminal and a second terminal, wherein the first terminal of the second capacitor is coupled to the second terminal of the second inductor, and the second terminal of the second capacitor is coupled to the second terminal of the AC to DC converter.

7. The arc suppression device of claim 6, wherein an inductance of the first inductor larger than an inductance of the second inductor.

8. The arc suppression device of claim 6, wherein a capacitance of the first capacitor is larger than a capacitance of the second capacitor.

9. The arc suppression device of claim 1, wherein the controller is further configured to control the switch to electrically connect the AC to DC converter and the plasma chamber to adjust the plasma current to a second current value after controlling the switch to electrically isolate the AC to DC converter and the plasma chamber and a first time period passes, wherein the second current value is larger than the first current value.

10. The arc suppression device of claim 1, wherein the controller is further configured to detect a plasma voltage received by the plasma chamber, wherein the controller is further configured to control the switch to electrically isolate the AC to DC converter and the plasma chamber to reduce the plasma current to the first current value through the resistor when the controller determines that the unit-time ROC of the plasma current is larger than the first unit-time ROC threshold and the plasma voltage is smaller than a first voltage threshold, and wherein the plasma voltage is associated with the DC voltage.

11. The arc suppression device of claim 10, wherein the controller is further configured to cut off the AC to DC converter when the controller determines that the unit-time ROC of the plasma current is larger than a second unit-time ROC threshold and the plasma voltage is smaller than a second voltage threshold.

12. An arc suppression method, comprising:

by a controller, controlling a switch to electrically isolate an AC to DC converter and a plasma chamber to reduce the plasma current to a first current value through a resistor when a unit-time ROC of a plasma current received by a plasma chamber is determined to be larger than a first unit-time ROC threshold, wherein the switch is electrically coupled between the AC to DC converter and the plasma chamber, and the resistor is coupled in parallel with the switch.

13. The arc suppression method of claim 12, further comprising:

by the controller, cutting off the AC to DC converter when the unit-time ROC of the plasma current is determined to be larger than a second unit-time ROC threshold.

14. The arc suppression method of claim 12, further comprising:

by the controller, after controlling the switch to electrically isolate the AC to DC converter and the plasma chamber and a first time period passes, controlling the switch to electrically connect the AC to DC converter and the plasma chamber to adjust the plasma current to a second current value, wherein the second current value is larger than the first current value.

15. The arc suppression method of claim 12, further comprising:

by the controller, controlling the switch to electrically isolate the AC to DC converter and the plasma chamber to reduce the plasma current to a first current value through the resistor when the unit-time ROC of the plasma current is determined to be larger than the first unit-time ROC threshold and a plasma voltage received by the plasma chamber is smaller than a first voltage threshold.

16. The arc suppression method of claim 15, further comprising:

by the controller, cutting off the AC to DC converter when the unit-time ROC of the plasma current is determined to be larger than a second unit-time ROC threshold and the plasma voltage is a second voltage threshold.

* * * * *